(12) United States Patent
Zhong et al.

(10) Patent No.: US 9,412,657 B2
(45) Date of Patent: Aug. 9, 2016

(54) METHOD FOR MANUFACTURING SEMICONDUCTOR DEVICE

(71) Applicant: Institute of Microelectronics, Chinese Academy of Sciences, Beijing (CN)

(72) Inventors: Huicai Zhong, San Jose, CA (US); Chao Zhao, Belgium (BE); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/943,706

(22) Filed: Nov. 17, 2015

(65) Prior Publication Data

US 2016/0163592 A1    Jun. 9, 2016

(30) Foreign Application Priority Data

Dec. 9, 2014   (CN) .......................... 2014 1 0748850

(51) Int. Cl.
   *H01L 21/4763*   (2006.01)
   *H01L 21/768*   (2006.01)

(52) U.S. Cl.
   CPC ...... *H01L 21/76883* (2013.01); *H01L 21/7684* (2013.01); *H01L 21/76898* (2013.01)

(58) Field of Classification Search
   None
   See application file for complete search history.

(56) References Cited

U.S. PATENT DOCUMENTS

| | | | |
|---|---|---|---|
| 2013/0026643 A1* | 1/2013 | England ................ | H01L 21/561 257/774 |
| 2015/0091066 A1* | 4/2015 | Lee ................... | H01L 21/76898 257/255 |
| 2016/0049384 A1* | 2/2016 | Lu ..................... | H01L 21/76877 257/737 |

* cited by examiner

*Primary Examiner* — Angel Roman
(74) *Attorney, Agent, or Firm* — BainwoodHuang

(57) ABSTRACT

In a method for manufacturing a semiconductor, a Through Silicon Via (TSV) template wafer and production wafers form a sandwich structure, in which the TSV template wafer has TSV structures uniformly distributed therein, for providing electrical connection between the production wafers to form 3D interconnection. The TSV template wafer is obtained by thinning a semiconductor wafer, which facilitates reducing the difficulty in etching and filling. Connection parts are provided on the TSV template wafer, for convenience of interconnection between the overlying and underlying production wafers, which facilitates reducing the difficulty in alignment and improving the convenience of design of electrical connection for 3D devices.

9 Claims, 3 Drawing Sheets

METHOD FOR MANUFACTURING SEMICONDUCTOR DEVICE

CROSS REFERENCE TO RELATED APPLICATION(S)

This application claims benefit from Chinese Application No. 201410748850.X, filed with SIPO, China on Dec. 9, 2014, entirety of which is incorporated herein by reference.

TECHNICAL FIELD

The present disclosure relates to manufacture of semiconductor devices, and particularly, to a method for manufacturing a three-dimensional (3D) device formed using a Through Silicon Via (TSV) template wafer.

BACKGROUND

Feature sizes of integrated circuits are increasingly scaled down and TSVs for 3D interconnection are also increasingly being decreased in size with continuous progress in semiconductor processes. Patterning, etching and filling processes for the TSVs encounter unprecedented challenges. Etching and filling for TSV trenches, with increased depth-to-width ratio due to scaling down thereof, are becoming increasingly difficult. Conventional etching and filling processes gradually fail to meet the industrial requirements. Consequently, there is a need for an improved TSV structure for 3D interconnection and a method for manufacturing the same, so as to meet the requirements of the technological development.

SUMMARY

The present disclosure proposes a method for manufacturing a semiconductor device, and particularly, a method for manufacturing a 3D device formed using a TSV template wafer.

According to an aspect of the present disclosure, there is provided a method for manufacturing a semiconductor device, comprising steps of: providing a Through Silicon Via (TSV) template wafer with a front side and a back side, and forming a number of uniformly distributed TSV holes on the TSV template wafer through photolithography and etching; filling a conductive material in the TSV holes; planarizing the TSV template wafer, so that the conductive material is located only in the TSV holes; removing portions of the conductive material in the TSV holes from the front and back sides of the TSV template wafer respectively through selective etching, and then filling a dielectric material in the TSV holes and planarizing the TSV template wafer; patterning connection regions on the front and back sides of the TSV template wafer to form trenches in the connection regions through photolithography and etching, and filling a conductive material in the trenches in the connection regions, to form connection parts; and providing production wafers on the front and back sides of the TSV template wafer respectively and bonding the production wafers with the TSV template wafer, to form a sandwich structure of the production wafer-the TSV template wafer-the production wafer, in which the production wafers are electrically connected through the connection parts in the TSV template wafer and the conductive material in the TSV holes.

According to an aspect of the present disclosure, the TSV template wafer comprises a semiconductor wafer, which is thinned by 2-200 nm in thickness.

According to an aspect of the present disclosure, the TSV holes each have a diameter of 40-200 nm, and have a spacing between each two adjacent holes of 40-200 nm.

According to an aspect of the present disclosure, the conductive material filled in the TSV holes comprises one or more of Cu, Al, or TiN.

According to an aspect of the present disclosure, the conductive material is filled in the TSV holes by immersing the TSV template wafer in melted Al and then cooling it down.

According to an aspect of the present disclosure, the portion of the conductive material removed from the TSV holes has a thickness of 10-100 nm.

According to an aspect of the present disclosure, the trenches in the connection regions expose the conductive material in the TSV holes, so that the connection parts are in direct contact with the conductive material in the TSV holes.

According to an aspect of the present disclosure, the production wafers each have a TSV, which is larger than the TSV hole in the TSV template wafer in size. The TSVs of the production wafers are electrically connected to the connection parts in the TSV template wafer and the conductive material in the TSV holes, so that the production wafers on the front and back sides of the TSV template wafer are interconnected.

The present disclosure has the following advantages. The TSV template wafer and the production wafers form a sandwich structure, in which the TSV template wafer has TSV structures uniformly distributed therein, for providing electrical connection between the production wafers to form 3D interconnection. The TSV template wafer is obtained by thinning a semiconductor wafer, which facilitates reducing the difficulty in etching and filling. Connection parts are provided on the TSV template wafer, for convenience of interconnection between the overlying and underlying production wafers, which facilitates reducing the difficulty in alignment and improving the convenience of design of electrical connection for 3D devices.

DETAILED DESCRIPTION

Hereinafter, the present disclosure is described with reference to specific embodiments shown in the attached drawings. However, it is to be understood that those descriptions are just provided for illustrative purpose, rather than limiting the scope of the present disclosure. Further, in the following, descriptions of known structures and techniques are omitted so as not to obscure the concept of the present disclosure.

The present disclosure provides a method for manufacturing a semiconductor device, and particularly, a method for manufacturing a 3D device formed using a TSV template wafer. A method for manufacturing a semiconductor device according to an embodiment of the present disclosure will be described in detail below in conjunction with FIGS. 1-8.

Figure 1:
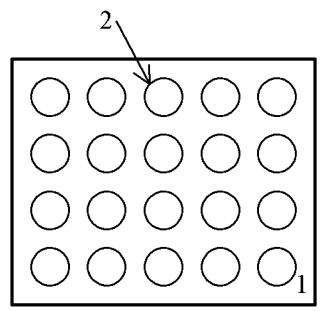
FIG. 1 is a top view showing a TSV template wafer.
Figure 2:
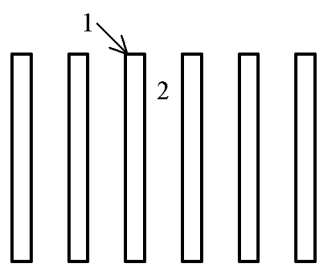
FIG. 2 is a cross-sectional view showing a template wafer with TSV holes.

Firstly, as shown in FIGS. 1 and 2 (FIG. 1 is a top view, and FIG. 2 is a cross-sectional view), a TSV template wafer 1 with a front side and a back side is provided, and a number of uniformly distributed TSV holes 2 are formed on the TSV template wafer 1 through photolithography and etching. The TSV template wafer 1 comprises a semiconductor wafer, for example, a silicon wafer, which is thinned by 2-200 nm in thickness. With the thinned wafer, the difficulty in processes for etching the TSV holes and subsequently filling the TSV holes can be reduced, for the sake of smooth implementation of the whole process flow. Further, the formed TSV holes 2 are uniformly distributed across the whole template wafer, and run through the TSV template wafer 1 from the front side to the back side. The holes each have a diameter of 40-200 nm, and have a spacing between each two adjacent holes of 40-200 nm.

Figure 3:
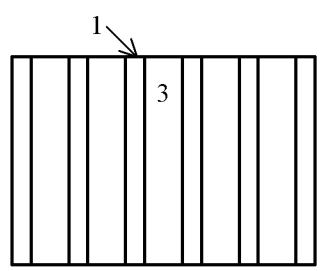
FIG. 3 is a view showing filling TSVs with a conductive material.

Next, as shown in FIG. 3, the TSV holes 2 are filled with a conductive material 3, and then the TSV template wafer 1 is planarized, so that the conductive material 3 is located only within the TSV holes 2. The conductive material 3 comprises one or more of Cu, Al, or TiN. Alternatively, for convenience of filling, the TSV template wafer 1 may be immersed into melted Al for filling, which is cooled down to form the conductive material 3.

Figure 4:
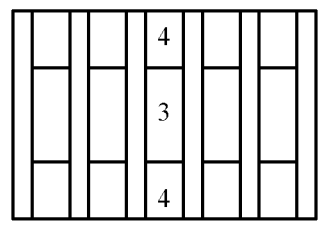
FIG. 4 is a view showing filling a dielectric material.

Next, as shown in FIG. 4, portions of the conductive material 3 in the TSV holes 2 are removed from both the front side and back side of the TSV template wafer 1 through selective etching. Then, the TSV holes 2 are filled with a dielectric material 4, and the TSV template wafer 1 is planarized. The selective etching comprises wet etching or dry etching, which is used to remove the portions of the conductive material 3 from the TSV holes 2 to form grooves. Then, the grooves are filled with the dielectric material 4, for example, $SiO_2$, and then the TSV template wafer 1 is planarized, to make the front and back sides planar. In this way, opposite ends of the conductive material 3 are enclosed by the dielectric material 4.

Figure 5:
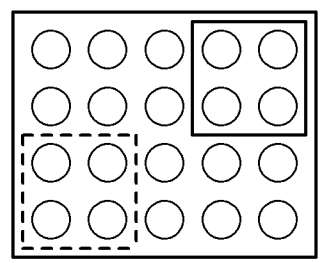
FIG. 5 is a top view showing connection regions.
Figure 6:
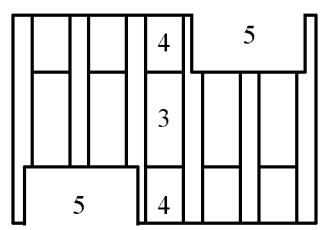
FIG. 6 is a view showing etching trenches in connection regions.
Figure 7:
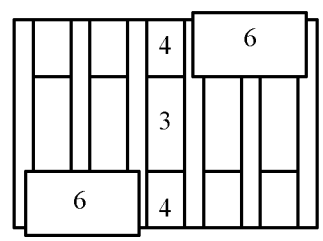
FIG. 7 is a view showing forming connection parts through filling.

As shown in FIG. 5-7, connection regions are patterned on the front and back sides of the TSV template wafer 1. Specifically, trenches 5 are formed in the connection regions through photolithography and etching, and then filled with a conductive material to form connection parts 6. As shown in FIG. 5, a solid block at the top-right corner and a dotted block at the bottom-left corner schematically show connection regions on the front and back sides of the TSV template wafer 1, respectively. It is to be noted that the connection regions may be specifically set according to requirements. Generally, a single connection region covers multiple TSV holes 2. As shown in FIG. 6, portions of the wafer, the dielectric material and the conductive material in the connection regions are removed through photolithography and etching, to form the trenches 5 in the connection regions. The trenches 5 in the connection regions should expose remaining portions of the conductive material 3 in the TSV holes 2, so that the connection parts which are then formed in the trenches can be in direct contact with the conductive material 3, to conduct current. Next, as shown in FIG. 7, the trenches 5 in the connection regions are filled with a conductive material, to form the connection parts 6. The conductive material used for the connection parts 6 may be the same as or different from the conductive material 3, for example, one or more selected from Cu, Al, and TiN.

Figure 8:
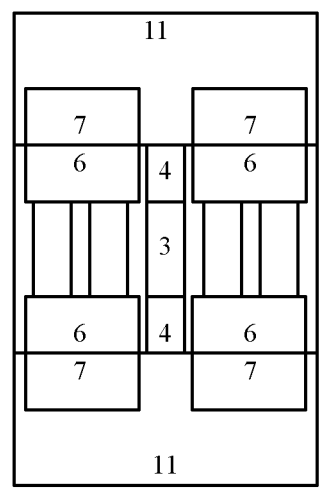
FIG. 8 is a view showing forming 3D interconnection.

Next, as shown in FIG. 8, production wafers 11 are provided on the front and back sides of the TSV template wafer 1, respectively, and the production wafers 11 are bonded with the TSV template wafer 1, to form a sandwich structure of the production wafer-the TSV template wafer-the production wafer, in which the two production wafers 11 are electrically connected through the connection parts 6 in the TSV template wafer 1 and the conductive material 3 in the TSV holes. The production wafer 11 also has a TSV 7, which is larger than the TSV hole 2 in the TSV template wafer 1 in size. As the TSV 7 is larger than the TSV hole 2 in size, the difficulty in bonding alignment is reduced. The TSVs 7 correspond to the connection parts 6 in the TSV template wafer 1, and the TSVs 7 can be electrically connected to the connection parts 6 and the conductive material 3 in the TSV holes 2, so that two production wafers 11 on the front and back sides of the TSV template wafer 1 are interconnected. In the present disclosure, the inventive TSV template wafer is used to connect two production wafers to form a sandwich structure. In this way, it is possible to achieve an interconnection structure for 3D devices in a simple and accurate manner, which is beneficial to further improve the integration density of the 3D devices.

The present disclosure is described above with reference to the embodiments thereof. However, those embodiments are provided just for illustrative purpose, rather than limiting the scope of the present disclosure. The scope of the disclosure is defined by the attached claims as well as equivalents thereof. Those skilled in the art can make various alternations and modifications without departing from the scope of the disclosure, which all fall within the scope of the disclosure.

We claim:

1. A method for manufacturing a semiconductor device, comprising:
    providing a Through Silicon Via (TSV) template wafer with a front side and a back side, and forming a number of uniformly distributed TSV holes on the TSV template wafer through photolithography and etching;
    filling a conductive material in the TSV holes;
    planarizing the TSV template wafer, so that the conductive material is located only in the TSV holes;
    removing portions of the conductive material in the TSV holes from the front and back sides of the TSV template wafer respectively through selective etching, and then filling a dielectric material in the TSV holes and planarizing the TSV template wafer;
    patterning connection regions on the front and back sides of the TSV template wafer to form trenches in the connection regions through photolithography and etching, and filling a conductive material in the trenches in the connection regions, to form connection parts; and
    providing production wafers on the front and back sides of the TSV template wafer respectively and bonding the production wafers with the TSV template wafer, to form a sandwich structure of the production wafer-the TSV template wafer-the production wafer, in which the production wafers are electrically connected by the connection parts in the TSV template wafer and the conductive material in the TSV holes.

2. The method according to claim 1, wherein the TSV template wafer comprises a semiconductor wafer, which is thinned by 2-200 nm in thickness.

3. The method according to claim 1, wherein the TSV holes each have a diameter of 40-200 nm, and have a spacing between each two adjacent holes of 40-200 nm.

4. The method according to claim 1, wherein the conductive material filled in the TSV holes comprises one or more of Cu, Al, or TiN.

5. The method according to claim 1, wherein the conductive material is filled in the TSV holes by immersing the TSV template wafer in melted Al and then cooling it down.

6. The method according to claim 1, wherein the portion of the conductive material removed from the TSV holes has a thickness of 10-100 nm.

7. The method according to claim 1, wherein the trenches in the connection regions expose the conductive material in the TSV holes, so that the connection parts are in direct contact with the conductive material in the TSV holes.

8. The method according to claim 1, wherein the production wafers each have a TSV, which is larger than the TSV hole in the TSV template wafer in size.

9. The method according to claim 8, wherein the TSVs of the production wafers are electrically connected to the connection parts in the TSV template wafer and the conductive material in the TSV holes, so that the production wafers on the front and back sides of the TSV template wafer are interconnected.

\* \* \* \* \*